United States Patent [19]

Fox

[11] Patent Number: 4,766,400

[45] Date of Patent: Aug. 23, 1988

[54] VARIABLE-TRANSCONDUCTANCE FOUR-QUADRANT GILBERT-TYPE MODULATOR WITH FEEDBACK CIRCUITRY IN IMPROVED NMR TRANSMISSION

[75] Inventor: Timothy R. Fox, Chicago, Ill.

[73] Assignee: Kabushiki Kaisha Toshiba, Kawasaki, Japan

[21] Appl. No.: 943,799

[22] Filed: Dec. 19, 1986

[51] Int. Cl.⁴ .................. G01R 33/22; H03K 7/00
[52] U.S. Cl. ............................ 332/9 R; 324/309; 332/9 T; 332/31 T; 332/37 D; 332/44
[58] Field of Search ............... 332/31 R, 31 T, 37 R, 332/37 D, 44, 9 R, 9 T; 455/108, 109, 46, 47; 324/309

[56] References Cited

U.S. PATENT DOCUMENTS 4,403,194  9/1983  Talbot ........................ 332/31 T
4,654,607  3/1987  Ishikawa ..................... 332/31 T

OTHER PUBLICATIONS

B. Gilbert, "A Precise Four-Quadrant Multiplier with Subnanosecond Response", IEEE Journal of Solid-State Circuits, SC-3, No. 4, pp. 365–367 (Dec. 1968).

Clarke et al., Communication Circuits: Analysis and Design (Addison-Wesley Publishing Company 1971).

Primary Examiner—Siegfried H. Grimm
Attorney, Agent, or Firm—Finnegan, Henderson, Farabow, Garrett & Dunner

[57] ABSTRACT

A variable-transconductance four-quadrant Gilbert-type modulator comprises a differential-transconductance amplifier, a fixed current source, a current sensing resistor, variable-transconductance circuitry, and feedback circuitry. The feedback circuitry is operatively connected to the differential-transconductance amplifier and to the current sensing resistor to receive the modulation voltage signal and to cause the voltage across the current sensing resistor to follow the voltage of the modulation voltage signal thereby causing the differential output current of the differential-transconductance amplifier to be directly proportional to the voltage on its input port thereby improving the linearity of the modulator. Also provided is an isolation output amplifier on the modulated output of the modulator to improve isolation between the carrier input signal and the modulated output.

6 Claims, 5 Drawing Sheets

VARIABLE-TRANSCONDUCTANCE FOUR-QUADRANT GILBERT-TYPE MODULATOR WITH FEEDBACK CIRCUITRY IN IMPROVED NMR TRANSMISSION

BACKGROUND OF THE INVENTION

1. Field of the Invention

The present invention relates, in general, to balanced modulators and, more particularly, to variable transconductance four-quadrant Gilbert-type modulators with improved linearity and improved carrier suppression.

2. Description of Related Art

Analog modulators and multipliers are well known. One particular type of well known multiplier circuit is a variable-transconductance four-quadrant differential-pair or Gilbert-type multiplier. Such circuits are designed for use where the output of the circuit is a linear product of two input voltages. Typically, the linear product is adjustable by a scale factor. The basic differential-pair multiplier was introduced in B. Gilbert, "A Precise Four-Quadrant Multiplier With Subnanosecond Response," *IEEE Journal of Solid State Circuits*, SC-3, No. 4, pages 365–367 (December 1968). See also, Clarke et al., *Communication Circuits: Analysis And Design* (Addison-Wesley Publishing Co. 1971), pages 362–373, for a textbook treatment of the Gilbert-type multiplier. The four-quadrant Gilbert-type multiplier is readily available in integrated circuit form. For example, Motorola Semiconductors produces a four-quadrant multiplier chip known as an MC1595L chip.

Where one input to the above-described variable-transconductance four-quadrant Gilbert-type multiplier is a carrier signal and the other input is a modulation input, the multiplier becomes a useful modulator. Such a modulator is commonly known as a balanced, suppressed carrier, or double sideband modulator as well as a variable-transconductance four-quadrant Gilbert-type modulator. Practical uses of these types of modulators include AM transmission and reception and generation of pulses of modulated radio-frequency ("RF") current in the transmission circuitry of magnetic resonance imaging ("MRI") systems (also known as nuclear magnetic resonance ("NMR") imaging systems). In the MRI system, the modulated RF current is used to generate an alternating magnetic field for the controlled excitation of the nuclei of the body being examined.

A variable-transconductance four-quadrant Gilbert-type modulator is shown in block diagramatic form in FIG. 1 as element 10. Modulation input voltage A(t) is input into modulator 10 at modulation input port 11, and carrier input signal $V_c(t)$ is input at carrier input port 12. The resulting modulated output $V_{out}(t)$ is produced at modulated output port 13 of modulator 10. Contained in the modulator are differential-transconductance amplifier 14, two fixed current sources 15, current sensing resistor $R_1$, and variable-transconductance circuitry 16. Differential-transconductance amplifier 14 has input port 17 consisting of two leads for receiving the modulation input voltage, has common port 18 for receiving drive currents from fixed current sources 15, and has output port 19. Differential-transconductance amplifier 14 includes two active devices 20, 21 having their input (20A, 21A), output (20B, 21B), and common (20C, 21C) leads as shown in FIG. 2. Active devices 20, 21 could be, for example, bipolar transistors in which the inputs (20A, 21A) are the bases of the transistors, the outputs (20B, 21B) are the collectors, and the common (20C, 21C) leads are from the emitters. The active devices could also be JFETs, for example, with the gates as inputs, sources as outputs, and drains as commons.

The currents on the input leads to active devices (20, 21) are negligible with respect to the currents on the output and common leads. Thus, the sum of the drive currents provided by fixed current sources 15 into common port 18 equals the sum of the output currents on output port 19 of differential-transconductance amplifier 14. A variation in the modulation input voltage on modulation input port 11 of modulator 10 and, thus, on input port 17 of differential-transconductance amplifier 14 will produce a change in amplifier 14's differential output current on its output port 19.

As shown in FIGS. 1 and 2, current sensing resistor $R_1$ is connected across the two leads of common port 18 of differential-transconductor amplifier 14 to provide local feedback in modulator 10. As shown in FIG. 3, a single fixed current source 22 can be used with two current sensing resistors having a value of one-half $R_1$ each to provide the necessary drive currents.

Variable-transconductance circuitry 16 receives the carrier input signal $V_c(t)$ on carrier input port 12 and also receives the differential output current from output port 19 of differential-transconductance amplifier 14. The gain between carrier input and modulated output of variable-transconductance 16 is varied by variable-transconductance circuitry 16's response to the differential output current received from differential-transconductance amplifier 14 thus providing modulation of the carrier input signal.

One specific embodiment of variable-transconductance four-quadrant Gilbert-type modulator 10 is shown in FIG. 4. That circuit schematic is taken from Motorola Semiconductors' "Specifications and Applications Information MC1595L/MC1495L" concerning Motorola's linear four-quadrant multiplier integrated circuit. The complete schematic illustrated in FIG. 4 shows a linearized Gilbert-type multiplier; however, the right-half of the schematic is a common modulator of the type described above and illustrated in FIGS. 1 and 2. The schematic includes designations to show corresponding parts between the block diagramatic parts of modulator 10 in FIG. 1 with those parts in the schematic in FIG. 4. The schematic also contains the integrated circuit pin numbering P1 through P14 for the Motorola MC1595L chip. Furthermore, the schematic of FIG. 4 shows current sensing resistor $R_1$ added which is not provided on the Motorola chip itself.

The desired modulated output of the modulator is $$V_{out}(t) = A(t) \times \sin\omega_c t, \quad (1)$$

where the angular frequency $\omega_c$ is the carrier frequency and A(t) is the modulation signal. The actual input voltages to the modulator are a carrier input signal voltage $V_c(t) = V_r \sin\omega_c t$ and a modulation input voltage $V_b(t) = A(t)$. With these input voltages, the ideal modulator output would be $$V_{out} = (V_c \times V_b)/V_m, \quad (2)$$

where $1/V_m$ is a scale factor constant which determines the magnitude of the output voltage.

In practice, however, modulators have two significant deficiencies. The non-ideal modulator's deficiencies are a complicated function of the modulator's two inputs $A = A(t)$ and $B = V_r \sin \omega_c t$ and can be expressed using a Taylor series expansion as follows:

$$V_{out} = k_{00} + k_{01}B + k_{10}A + k_{11}AB + \quad (3)$$
$$+ k_{21}A^2B + k_3A^3B + \ldots +$$
$$+ k_{12}AB^2 + k_{13}AB^3 + \ldots + \ldots$$
$$= \sum_{ij}^{\infty} k_{ij}A^iB^j.$$

In the ideal case, $k_{11} = V_r/V_m$ and all other $k_{ij} = 0$.

The more important deficiencies in the non-ideal modulator are non-linearity and carrier feedthrough. A non-linear relationship between the modulation input and the modulated output, particularly at frequencies near the carrier frequency, is of considerable concern. Such non-linearity in an AM transmitter results in distortion in the demodulated signal in the receiver. In an MRI system, the unwanted non-linearity would cause the generation of imprecise pulses of modulated RF current which, in turn, results in imprecise generation of the necessary alternating magnetic field and, therefore, the incorrectly controlled excitation of the nuclei of the body being studied. The end result would be an ill-defined image.

Each of the terms after the first line in equation (3) above can be classified as non-linearity. In a normal case where the modulation signal is a much lower frequency than the carrier frequency (for example, an audio signal for modulation and radio frequency for the carrier), the most important non-linearity terms of equation (3) are those in the second line of the equation. Those terms give the non-linear relationship between the modulation input and the RF output at frequencies near the carrier frequency. The other significant non-linear terms will appear at frequencies far removed from the carrier frequency.

Unwanted carrier feedthrough arises in a modulator where the output voltage Vout is not zero when the modulation input signal $A(t)$ is zero. For example, in the MRI system, with carrier feedthrough the modulator cannot "shut off" the RF excitation of the nuclei completely. In equation (3) above, the $k_{01}B$ term is the unwanted carrier feedthrough term. Typically, the contribution from this term in the modulator output voltage can be cancelled by shifting the zero of the modulation input signal $A(t)$ slightly so that the $k_{01}$ term is cancelled by the $k_{11}$ term. There are, however, usually other mechanisms in a modulator, such as capacitance from the carrier input to the modulated output, which bypass the modulator and cannot be totally cancelled by the shifting of the zero of the modulation input signal.

Another concern arising from the undesired carrier feedthrough appears when the modulation input is a function of time. In such a situation, when a sine wave having a d.c. level of zero is applied to the modulation input, the modulated output at the carrier frequency should be zero giving the desired suppressed carrier attributes of the modulator. However, in the prior art modulators, there is a measured output at the carrier frequency which is a function of the sine wave amplitude of the input even when the d.c. level of the input is accurately set to zero.

Other deviations from the ideal output voltage of a modulator include the d.c. offset term $k_{00}$ shown in equation (3), the modulation input feedthrough $k_{10}$ term, and the terms in the third line of equation (3). The d.c. offset term $k_{00}$ is not usually important since output circuitry after the modulator can contain circuitry which does not respond to d.c. Since the modulation input feedthrough $k_{10}$ is far below the carrier frequency and the terms in the third line of equation (3) give outputs close to harmonics of the carrier frequency, all of those terms can be removed by a suitable bandpass filter after the modulator's output. Such a filter would pass only frequencies near the carrier frequency and would reject both low frequencies (d.c. and modulation) and specified high frequencies (harmonics of the carrier frequency).

Even with the use of bandpass filters as discussed above and with the use of zero shifting of the modulation input signal $A(t)$, the existing variable-transconductance four-quadrant Gilbert-type modulators are still effected by unwanted non-linearity and carrier feedthrough in their outputs. Thus, from the above discussion, it should be apparent that there is a great need for an improved balanced modulator in which the problems of undesired non-linearity and carrier feedthrough are alleviated.

It is, thus, intended that the invention provide a variable-transconductance four-quadrant Gilbert-type modulator in which there is improved performance.

Another intent is that the invention provide a balanced modulator in which non-linearity between the modulation input and the modulated output is reduced.

Still another intent is that the invention provide a balanced modulator with reduced carrier feedthrough.

Other intentions and features of the invention will further become apparent with reference to the accompanying drawings and the detailed description of the invention or may be learned by practice of the invention.

SUMMARY OF THE INVENTION

To achieve the foregoing intentions and in accordance with the purpose of the invention, as embodied and broadly described herein a variable-transconductance four-quadrant Gilbert-type modulator has a differential-transconductance amplifier, having an input port for receiving an input voltage signal, an output port for a differential output current, and a common port having two leads, for providing a change in its differential output current on its output port when the voltage signal on its input port changes and a fixed current source for providing drive currents to the two leads of the common port of the differential-transconductance amplifier, the sum of the drive currents being approximately equal to the sum of the output currents of the differential-transconductance amplifier.

The modulator also has a current sensing resistor across the two leads of the common port of the differential-transconductance amplifier and has variable-transconductance circuitry, operatively connected to the output port of the differential-transconductance amplifier to receive the differential output current, having a carrier input port for receiving a carrier input signal, and having a modulated output port, responsive to the differential output current of the differential-transconductance amplifier to vary the gain of the carrier input signal to provide the modulated output.

Feedback circuitry is also provided in the modulator. The circuitry has a modulation input port for receiving a modulation voltage signal, a modulation output port operatively connected to the input port of the differential-transconductance amplifier for providing the modulator voltage signal to the differential-transconductance amplifier, and a feedback port with two leads operatively connected across the current sensing resistor, for causing the voltage across the current sensing resistor to follow the voltage of the modulation voltage signal thereby causing the differential output current of the differential-transconductance amplifier to be directly proportional to the voltage signal on its input port.

In a preferred embodiment, the feedback circuitry comprises a first operational amplifier having its non-inverting input operatively connected to one lead of the modulation input port, its inverting input operatively connected to one end of the current sensing resistor, and its output operatively connected to one lead of the input port of the differential-transconductance amplifier; and a second operational amplifier having its noninverting input operatively connected to the other lead of the modulation input port, its inverting input operatively connected to the other end of the current sensing resistor, and its output operatively connected to the other lead of the input port of the differential-transconductance amplifier. The outputs of the two operational amplifiers are the modulation output port of the feedback circuitry, the non-inverting inputs of the two operational amplifiers are the modulation input port of the feedback circuitry, and the inverting inputs of the two operational amplifiers are the feedback port of the feedback circuitry.

The variable-transconductance four-quadrant Gilbert-type modulator can also include an output amplifier, operatively connected to the modulated output port, for improving isolation between the carrier input signal and the modulated output by reducing the impedance on the modulated output port. In a preferred embodiment, the output amplifier means comprises a pair of matched JFETs having their gates grounded, the source of one JFET operatively connected to one lead of the modulated output port, the source of the other JFET operatively connected to the other lead of the modulated output port, and the drains of the JFETs are the output of the output amplifier.

BRIEF DESCRIPTION OF THE DRAWINGS

The accompanying drawings, which are incorporated in and constitute part of the specification, illustrate embodiments of the invention and, together with the description, serve to explain the principles of the invention. Of the drawings.

Reference will now be made in detail to the present preferred embodiments of the invention, examples of which are illustrated in the accompanied drawings.

DESCRIPTION OF THE PREFERRED EMBODIMENTS

Figure 1:
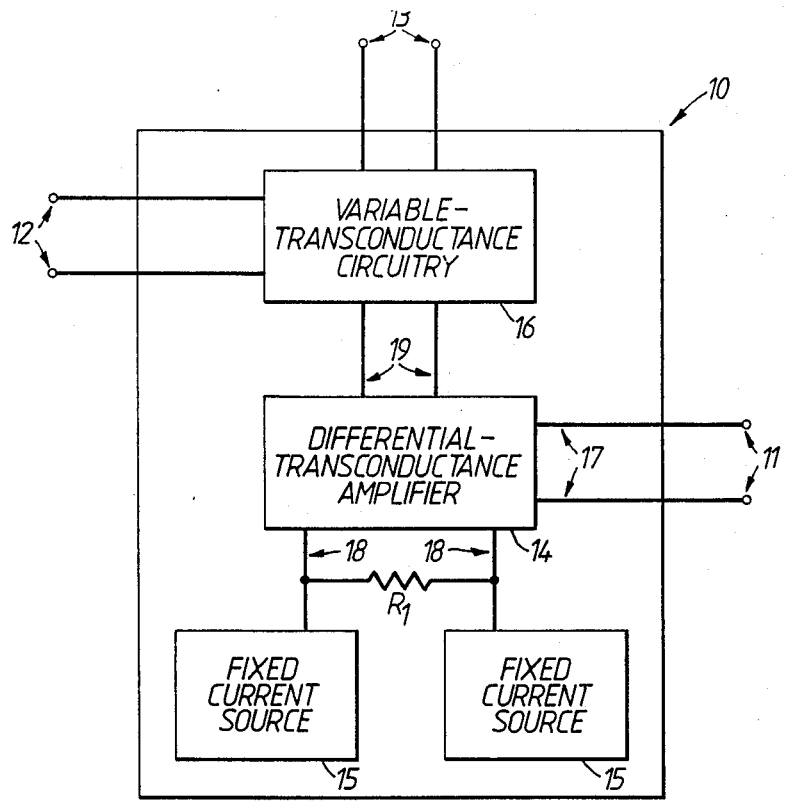
FIG. 1 is a block diagram of a well known variable-transconductance four-quadrant Gilbert-type modulator.
Figure 2:
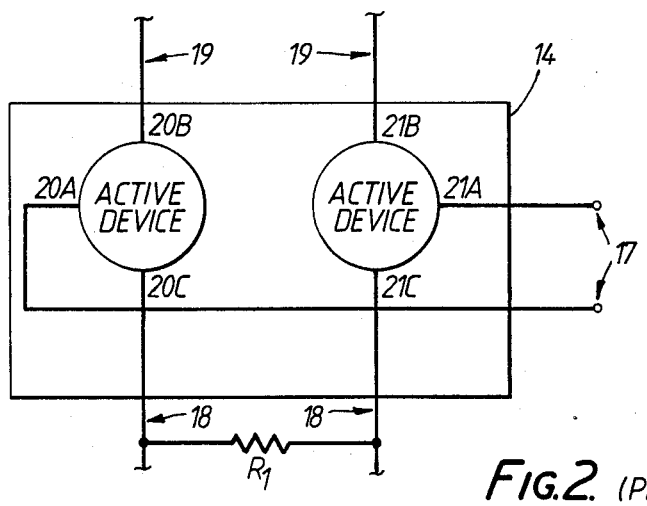
FIG. 2 is a block diagram showing the details of the differential-transconductance amplifier of the modulator illustrated in FIG. 1.
Figure 3:
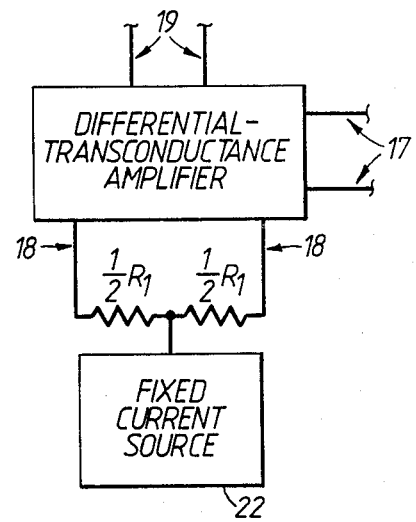
FIG. 3 is a block diagram of a portion of a well known variable-transconductance four-quadrant Gilbert-type modulator illustrating a different arrangement of fixed current source and current sensing resistor.
Figure 4:
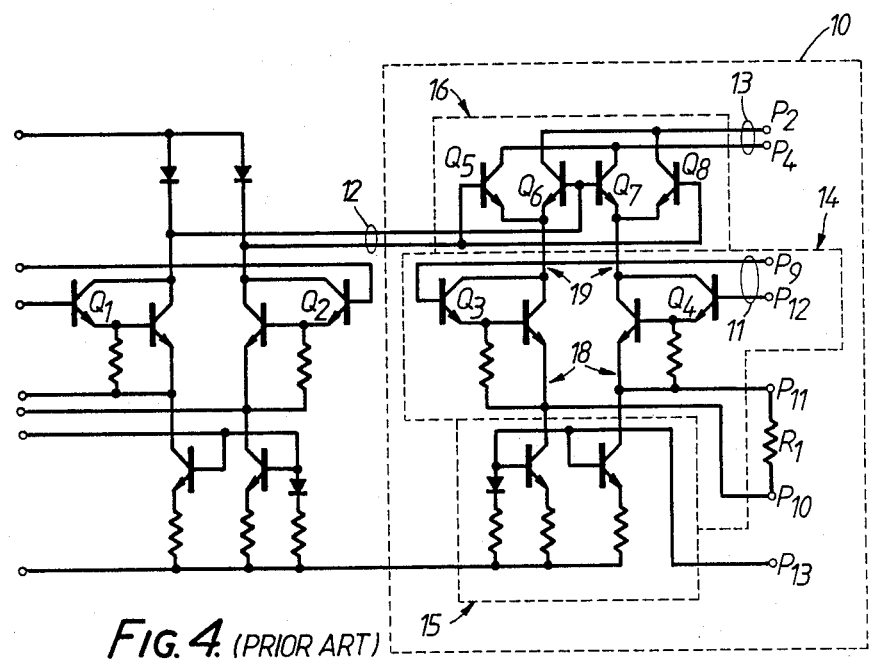
FIG. 4 is a schematic of a Motorola MC1595L linear four-quadrant multiplier integrated circuit showing corresponding parts to the variable-transconductance four-quadrant modulator of FIG. 1.
Figure 5:
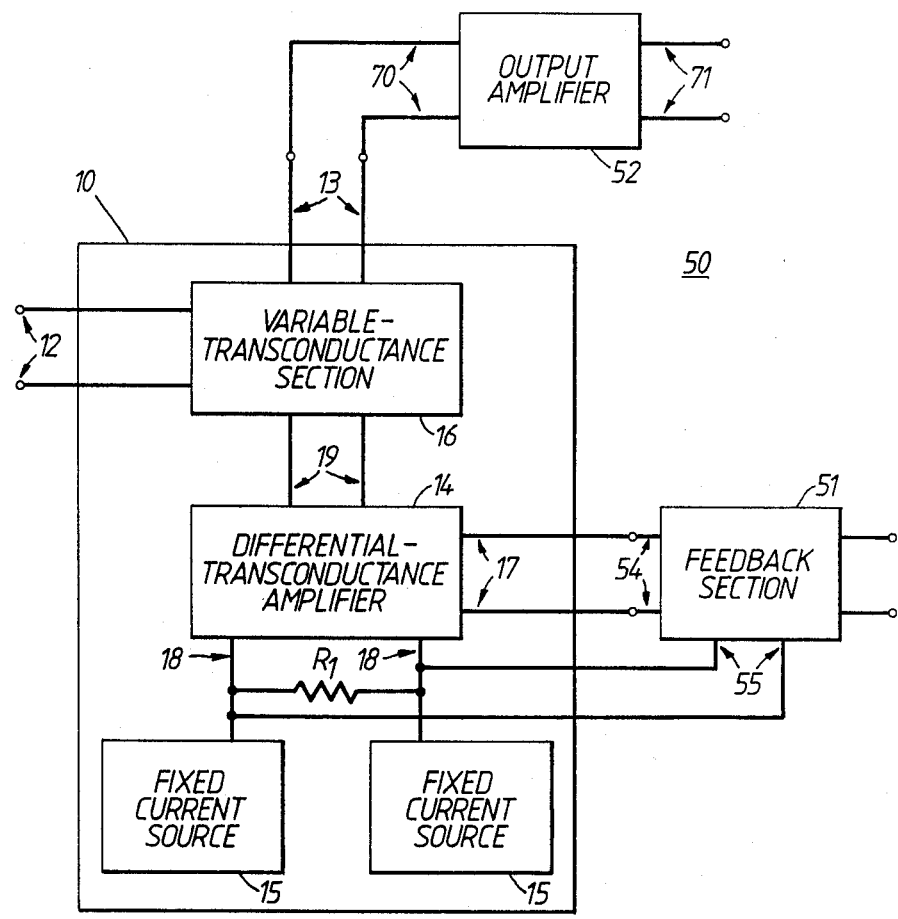
FIG. 5 is a block diagram of a variable-transconductance four-quadrant Gilbert-type modulator according to one preferred embodiment of the invention.

Referring again to the drawings, wherein like reference characters designate like or corresponding parts through the several drawings, there is shown in FIG. 5 variable-transconductance four-quadrant Gilbert-type modulator 50 in block diagrammatic form, a preferred embodiment of the invention. As shown in FIG. 5, improved balanced modulator 50 includes the basic variable-transconductance four-quadrant Gilbert-type modulator 10 shown in FIG. 1 and discussed above with feedback circuitry 51 and output amplifier 52 to reduce, respectively, unwanted non-linearity and carrier feedthrough of modulator 10.

As discussed above, the input on input port 17 controls the differential output current of amplifier 14 which is fed out of port 19 into variable-transconductance circuitry 16. The variation in that differential output current controls the gain from the carrier input to the output of variable-transconductance circuitry 16 to produce the modulated output. To improve the linearity of the differential output current of amplifier 14 with respect to the modulation input voltage and, thus, to improve the linearity of the modulated output with respect to the modulation input voltage, feedback circuitry 51 is added to modulator 10 as shown in FIG. 5.

Feedback circuitry 51 includes modulation input port 53 for receiving the modulation input voltage signal A(t), modulation output port 54 operatively connected to input port 17 of differential-transconductance amplifier 14 for providing the modulation voltage signal to amplifier 14, and feedback port 55 having two leads operatively connected across current sensing resistor $R_1$. Feedback circuitry 51 causes the voltage across current sensing resistor $R_1$ to follow the voltage of the modulation input voltage signal on modulation input port 53 and being fed into input port 17 of amplifier 14. This feedback taken from current sensing resistor $R_1$ thus causes the current through resistor $R_1$ to be directly proportional to the modulation input voltage which, in turn, causes the differential output current of amplifier 14 to be directly proportional to the voltage signal on its input port 17. This feedback provides a significant improvement in linearity of the modulated output at port 13 with respect to the modulation input voltage signal input into modulator 50.

Figure 6:
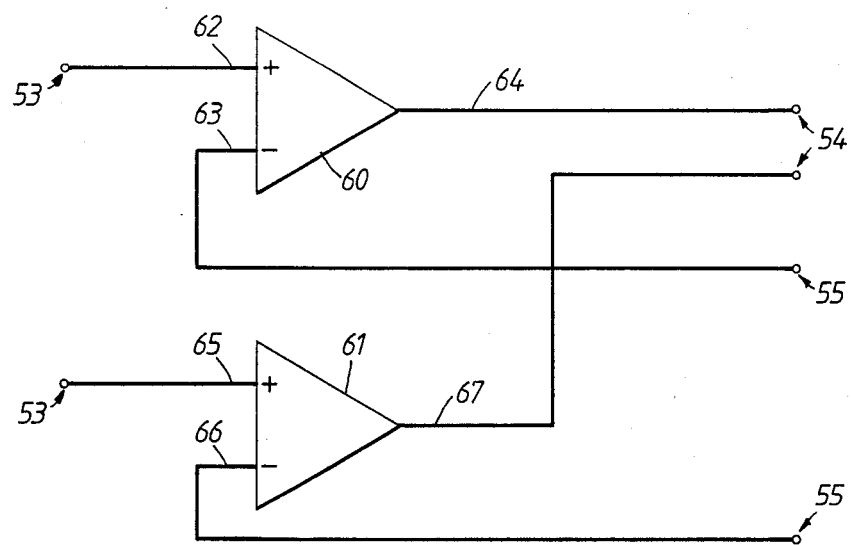
FIG. 6 is a schematic showing the details of the feedback circuitry of FIG. 5 according to one preferred embodiment of the invention.

A specific embodiment of the circuitry in feedback circuitry 51 is illustrated in FIG. 6. As shown in FIG. 6, two operational amplifiers 60, 61 are utilized with feedback taken from current sensing resistor $R_1$ (not shown in FIG. 6). Specifically, operational amplifier 60 has its non-inverting input 62 operatively connected to one lead of modulation input port 53 and its inverting input 63 operatively connected to one end of current sensing resistor $R_1$. Output 64 of operational amplifier 60 is operatively connected to one lead of input port 17 of differential-transconductance amplifier 14 (not shown in FIG. 6). Similarly, the second operational amplifier 61 has its noninverting input 65 operatively connected to the other lead of modulation input port 53 and its inverting input 66 operatively connected to the other end of current sensing resistor $R_1$. Output 67 of operational amplifier 61 is operatively connected to the other lead of input port 17 of amplifier 14. As shown in FIG. 6, the outputs 64, 67 of the two operational amplifiers 60, 61 are modulation output port 54 of feedback circuitry 51. The non-inverting inputs 62, 65 of the two operational amplifiers are modulation input port 53 of feedback circuitry 51, and the inverting inputs 63, 66 of the two operational amplifiers are feedback port 55 of the feedback circuitry.

The feedback circuitry causes the voltage on one end of current sensing resistor $R_1$ to follow the voltage on one lead of the modulation input port and causes the voltage on the other end of $R_1$ to follow the voltage on the other lead of the modulation input port. In the configuration shown in FIG. 6, for example, the feedback circuitry forces the voltage on input 63 (that is, one end of current sensing resistor $R_1$) to follow the voltage on input 62 (that is, one lead of modulation input port 53). Similarly, the voltage on input 66 will follow the voltage on input 65. If desired, one lead of the modulation input port could be grounded, thus causing the voltage on one end of $R_1$ to go to zero. With the feedback circuitry, as desired, the voltage across current sensing resistor $R_1$ is forced to follow the voltage of the modulation input voltage signal. As would be obvious to a person of ordinary skill in the art upon reviewing this disclosure, additional circuitry including power supplies are necessary to provide the desired operation of the feedback circuitry. One practical circuit is detailed below with reference to FIG. 8.

The above feedback circuitry produces the desired linearity improvement. To reduce the undesired carrier feedthrough of modulator 10, output amplifier 52 is connected to modulator output port 13 as shown in the improved balanced modulator 50 of FIG. 5. Output amplifier 52 produces improved isolation between the carrier input signal on carrier input port 12 and the modulated output port 13. The output amplifier is an isolation amplifier which reduces the impedance seen by modulator 10 itself thereby increasing the carrier bandwidth of the circuitry and reducing the undesired capacitive coupling which exists external to the circuitry of modulator 10 itself.

Figure 7:
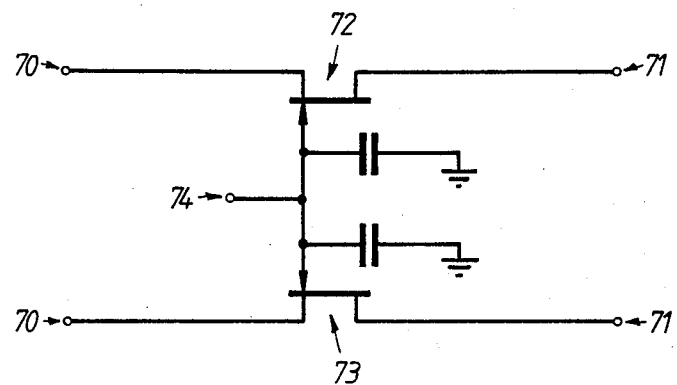
FIG. 7 is a schematic showing the details of the output amplifier of FIG. 5 according to one preferred embodiment of the invention.

A preferred embodiment of output amplifier 52 is shown in FIG. 7. Amplifier 52 has an input port 70 and output port 71 and includes a pair of matched JFETs 72, 73. The gates of the JFETs are grounded. The source of JFET 72 is one lead of the isolation amplifier's input port 70 and is operatively connected to one lead of modulator output port 13. The drain of that JFET is one lead of output port 71 of amplifier 52. Similarly, the source of JFET 72 is the other lead of input port 70 which is operatively connected to the other lead of modulated output port 13, and the drain of that JFET is the other lead of output port 71 of output amplifier 52. The necessary operating voltage for the gates of the JFETs is provided at terminal 74. The modulated output with improved carrier suppression is outputted from improved balanced modulator 50 at amplifier port 71.

Figure 8:
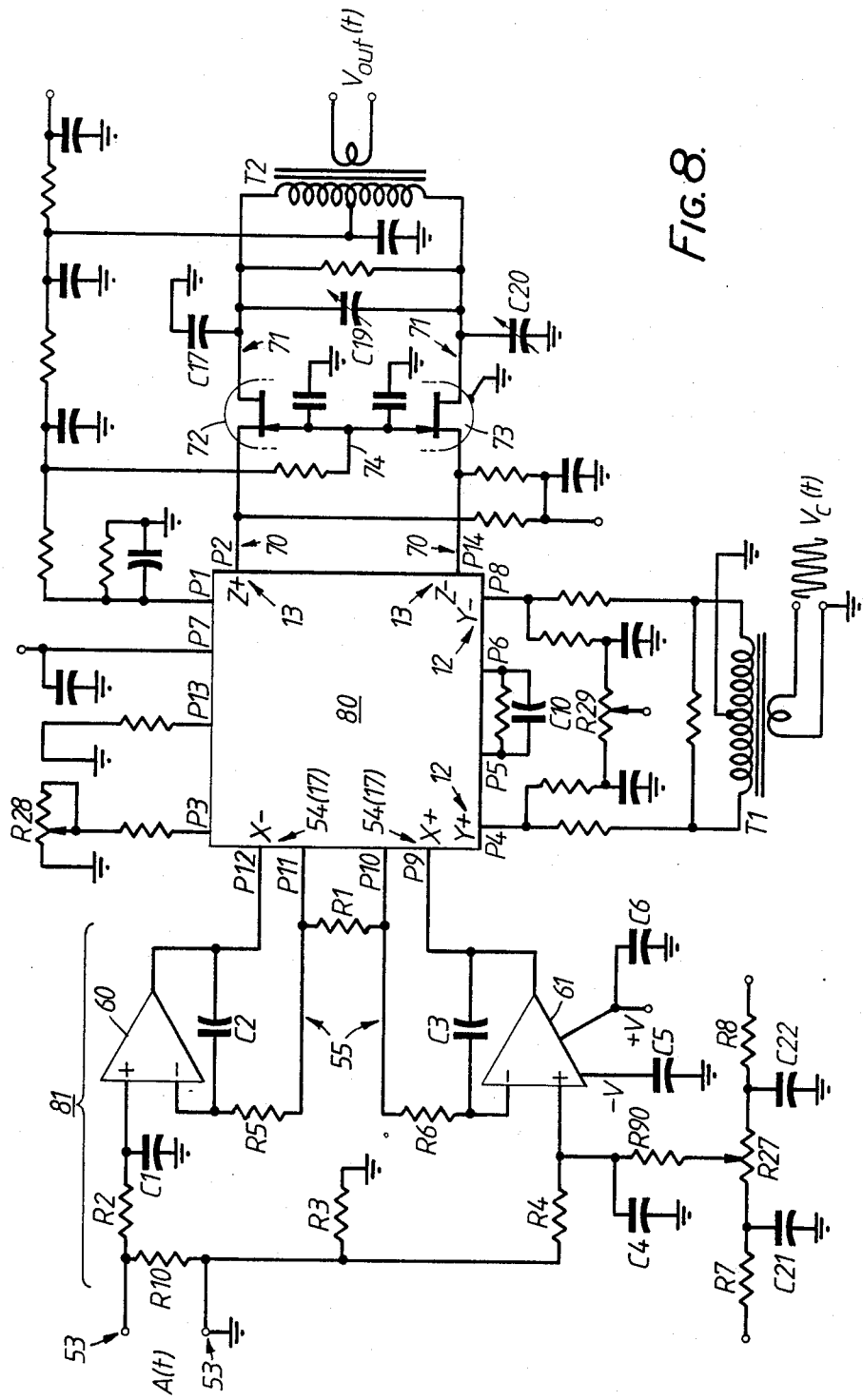
FIG. 8 is a schematic of a practical circuit of the variable-transconductance four-quadrant Gilbert-type modulator according to one preferred embodiment of the invention.

A practical circuit incorporating both of the above-described improvements is shown in FIG. 8. The circuit utilizes the Motorola MC1595L chip discussed above, which chip is designated element 80 on FIG. 8. The feedback circuitry is shown as operational amplifier circuit 81 comprising operational amplifiers 60, 61 and associated components are $R_2$ to $R_{10}$, $R_{27}$, $C_1$ to $C_6$, $C_{21}$, and $C_{22}$, along with current sensing resistor $R_1$, connected to the "X" input of chip 80. Output amplifier circuit 82 uses dual matched JFETs 72, 73 connected between the "Z" outputs of chip 80 and an output transformer T2. The carrier input is coupled to the "Y" input of chip 80 via center-tapped transformer T1.

In addition to well known components necessary to provide power to and control of chip 80, operational amplifiers 60, 61 and JFETs 72, 73, the practical circuitry in FIG. 8 includes capacitors $C_{17}$ and $C_{20}$ on output 71 of the output amplifier to assist in balancing the circuit at high frequencies. Capacitors $C_{10}$ and $C_{19}$ were added to flatten the frequency response of chip 80 from the carrier ("Y") input to the chip output ("Z"). Potentiometers $R_{27}$ and $R_{29}$ have been added to adjust for d.c. balance. $R_{27}$ is useful in adjusting the carrier suppression so that when the modulation input is zero, the output at carrier frequency can be adjusted to zero. $R_{29}$ is useful in adjusting the suppression of the modulation component in the output. Potentiometer $R_{28}$ has been added to adjust the gain of chip 80 in the normal manner.

Concerning the component values of the above briefly discussed practical circuitry, a person of ordinary skill in the art can readily select the desired component values and adjust the improved balanced modulator by utilizing the information provided in this disclosure, the information known on chip 80, and by the use of textbook circuit analysis.

The above practical circuit provides an improved performance over the prior art variable-transconductance four-quadrant Gilbert-type modulators in both linearity and carrier suppression.

It will be apparent to those skilled in the art that various modifications and variations can be made in the variable-transconductance four-quadrant Gilbert-type modulator of the present invention without departing from the scope or spirit of the invention. For example, the feedback circuitry can be utilized in both the "X" and "Y" inputs of a four-quadrant Gilbert-type multiplier to improve the linearity performance of the multiplier. Additionally, the input ports for modulation input and carrier input can be reversed. Thus, it is intended that the present invention covers the modifications and variations of this invention provided they come within the scope of the appended claims and their equivalents.

What is claimed:

1. In the transmission circuitry of a nuclear magnetic resonance imaging system, a variable-transconductance four-quadrant Gilbert-type modulator having reduced non-linearity for generating pulses of nuclear magnetic resonance imaging radio-frequency current, said modulator comprising:

a differential-transconductance amplifier, having an input port for receiving an input voltage signal, an output port for a differential output current, and a common port having two leads, for providing a change in its differential output current on its output port when the voltage signal on its input port changes;

a fixed current source for providing drive currents to the two leads of the common port of the differential-transconductance amplifier, the sum of the drive currents being approximately equal to the sum of the output currents of the differential transconductance amplifier;

a current sensing resistor coupled across the two leads of the common port of the differential-transconductance amplifier;

variable-transconductance circuitry, operatively connected to the output port of the differential-transconductance amplifier to receive the differential output current, having a nuclear magnetic resonance imaging carrier input port for receiving a nuclear magnetic resonance imaging carrier input signal, and having a modulated output port, responsive to the differential output current of the differential-transconductance amplifier to vary the gain of the carrier input signal to provide a modulated output in the form of the pulses of nuclear magnetic resonance imaging radio-frequency current for the transmission circuitry of the nuclear magnetic resonance imaging system; and feedback circuitry having a nuclear magnetic resonance imaging modulation input port for receiving a nuclear magnetic resonance imaging system modulation voltage signal, a modulation output port operatively connected to the input port of the differential-transconductance amplifier for providing the modulation voltage signal to the differential-transconductance amplifier, and a feedback port having two leads operatively connected across the current sensing resistor, for causing the voltage across the current sensing resistor to follow the voltage of the modulation voltage signal and cause the differential output current of the differential-transconductance amplifier to be directly proportional to the voltage signal on its input port.

2. The variable-transconductance four-quadrant Gilbert-type modulator of claim 1 wherein the feedback circuitry comprises:

a first operational amplifier having its non-inverting input operatively connected to one lead of the modulation input port, its inverting input operatively connected to one end of the current sensing resistor, and its output operatively connected to one lead of the input port of the differential-transconductance amplifier; and a second operational amplifier having its non-inverting input operatively connected to the other lead of the modulation input port, its inverting input operatively connected to the other end of the current sensing resistor, and its output operatively connected to the other lead of the input port of the differential-transconductance amplifier, wherein the outputs of the two operational amplifiers are the modulation output port of the feedback circuitry, the noninverting inputs of the two operational amplifiers are the modulation input port of the feedback circuitry, and the inverting inputs of the two operational amplifiers are the feedback port of the feedback circuitry.

3. The variable-transconductance four-quadrant Gilbert-type modulator of claim 2 wherein the feedback circuitry forces the voltage on one end of the current sensing resistor to zero and forces the voltage on the other end of the current sensing resistor to equal the voltage of the modulation voltage signal.

4. The variable-transconductance four-quadrant Gilbert-type modulator of claim 1 wherein the feedback circuitry causes the voltage across the current sensing resistor to be directly proportional to the voltage of the modulation voltage signal.

5. The variable-transconductance four-quadrant Gilbert-type modulator of claim 1 further comprising output amplifier means, operatively connected to the modulated output port, for improving isolation between the carrier input signal and the modulated output by reducing the impedance on the modulated output port.

6. The variable-transconductance four-quadrant Gilbert-type modulator of claim 5 wherein the output amplifier means comprises a pair of matched JFETs having their gates grounded, the source of one JFET operatively connected to one lead of the modulated output port, the source of the other JFET operatively connected to the other lead of the modulated output port, and the drains of the JFETs are the output of the output amplifier.

* * * * *